United States Patent
Sasaki et al.

(10) Patent No.: US 10,513,799 B2
(45) Date of Patent: *Dec. 24, 2019

(54) METHOD FOR MANUFACTURING SILICON CARBIDE SINGLE CRYSTAL

(71) Applicant: SUMITOMO ELECTRIC INDUSTRIES, LTD., Osaka-shi, Osaka (JP)

(72) Inventors: Sho Sasaki, Itami (JP); Shin Harada, Itami (JP); Tsutomu Hori, Itami (JP)

(73) Assignee: Sumitomo Electric Industries, Ltd., Osaka-shi, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/222,522

(22) Filed: Dec. 17, 2018

(65) Prior Publication Data

US 2019/0127880 A1 May 2, 2019

Related U.S. Application Data

(63) Continuation of application No. 15/535,848, filed as application No. PCT/JP2016/050119 on Jan. 5, 2016, now Pat. No. 10,246,797.

(30) Foreign Application Priority Data

Feb. 13, 2015 (JP) .................................. 2015-026537

(51) Int. Cl.
| | |
|---|---|
| *C30B 29/36* | (2006.01) |
| *C30B 29/06* | (2006.01) |
| *C30B 33/02* | (2006.01) |
| *C30B 35/00* | (2006.01) |
| *C30B 23/02* | (2006.01) |
| *C30B 23/06* | (2006.01) |

(52) U.S. Cl.
CPC .............. *C30B 29/36* (2013.01); *C30B 23/02* (2013.01); *C30B 23/066* (2013.01); *C30B 29/06* (2013.01); *C30B 33/02* (2013.01); *C30B 35/002* (2013.01); *C30B 35/007* (2013.01)

(58) Field of Classification Search
CPC combination set(s) only.
See application file for complete search history.

(56) References Cited

U.S. PATENT DOCUMENTS

| | | | |
|---|---|---|---|
| 2002/0083885 A1 | 7/2002 | Kuhn et al. | |
| 2013/0061801 A1* | 3/2013 | Fujiwara | C30B 23/002 |
| | | | 117/105 |

FOREIGN PATENT DOCUMENTS

| | | |
|---|---|---|
| CN | 1554808 A | 12/2004 |
| JP | 2012-510951 A | 5/2012 |
| WO | WO-2010/077639 A2 | 7/2010 |

OTHER PUBLICATIONS

Material Engineering Foundation, Bi Dasen, China Machine Press, Edition 1st, Feb. 2011, pp. 298.

(Continued)

*Primary Examiner* — Erin F Bergner
(74) *Attorney, Agent, or Firm* — Drinker Biddle & Reath LLP

(57) ABSTRACT

A method for manufacturing a silicon carbide single crystal includes: packing a silicon carbide source material into a crucible, the silicon carbide source material having a flowability index of not less than 70 and not more than 100; and sublimating the silicon carbide source material by heating the silicon carbide source material.

4 Claims, 2 Drawing Sheets

(56) References Cited

OTHER PUBLICATIONS

Chinese Office Action dated Jan. 3, 2019 that issued in Chinese patent application No. 201680004997.5, along with its English-language translation attached.

Wang, et al., "Increase of SiC sublimation growth rate by optimizing of powder packing," Mar. 2007, Journal of Crystal Growth, vol. 305, pp. 122-132.

* cited by examiner

METHOD FOR MANUFACTURING SILICON CARBIDE SINGLE CRYSTAL

CROSS-REFERENCE TO RELATED APPLICATIONS

This application is a continuation of copending U.S. patent application Ser. No. 15/535,848, filed Jun. 14, 2017, which is a § 371 of International Application No. PCT/JP2016/050119, filed Jan. 5, 2016, which claims the benefit of Japanese Patent Application No. 2015-026537, filed Feb. 13, 2015, the entire contents each of which are incorporated herein by reference.

TECHNICAL FIELD

The present disclosure relates to a method for manufacturing a silicon carbide single crystal.

BACKGROUND ART

Japanese National Patent Publication No. 2012-510951 (Patent Document 1) discloses a method for manufacturing a silicon carbide single crystal through a sublimation method.

CITATION LIST

Patent Document

PTD 1: Japanese National Patent Publication No. 2012-510951

SUMMARY OF INVENTION

Technical Problem

An object of the present disclosure is to provide a silicon carbide single crystal in which a different polytype is suppressed from being mixed.

Solution to Problem

A method for manufacturing a silicon carbide single crystal in the present disclosure includes: packing a silicon carbide source material into a crucible, the silicon carbide source material having a flowability index of not less than 70 and not more than 100; and sublimating the silicon carbide source material by heating the silicon carbide source material.

Advantageous Effects of Invention

According to the configuration above, there can be provided a silicon carbide single crystal in which a different polytype is suppressed from being mixed.

DESCRIPTION OF EMBODIMENTS

Figure 1:
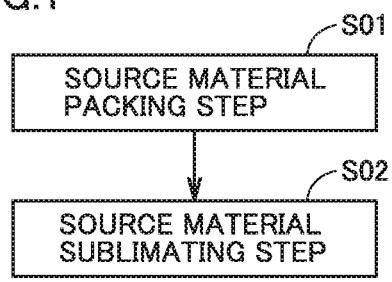
FIG. 1 is a flowchart schematically showing a method for manufacturing a silicon carbide single crystal in the present disclosure.

[Description of Embodiments of the Present Disclosure]

First, embodiments of the present disclosure are listed and described.

[1] A method for manufacturing a silicon carbide single crystal in the present disclosure includes: packing a silicon carbide source material into a crucible, the silicon carbide source material having a flowability index of not less than 70 and not more than 100; and sublimating the silicon carbide source material by heating the silicon carbide source material.

In the manufacturing method in [1], the silicon carbide single crystal is grown by the sublimation method. The sublimation method refers to a crystal growth method in which source material powders packed at the bottom portion of the crucible are sublimated at a high temperature to re-deposit the sublimated source material onto a seed crystal disposed at an upper portion of the crucible. The sublimation method is used to manufacture a silicon carbide bulk single crystal.

For a crystal structure of silicon carbide, various polytypes are confirmed. Representative examples thereof include 3C—SiC, 4H—SiC, 6H—SiC, 15R—SiC, and the like. Currently, 4H—SiC is useful for power devices. In manufacturing a bulk single crystal, it is important to suppress generation of a polytype other than the intended polytype, i.e., suppress generation of a different polytype because a mixed different polytype causes generation of micropipe defects, i.e., crystal defects in the form of hollow holes, due to crystal mismatch, with the result that crystal quality is deteriorated significantly.

Here, the present inventor found one of causes of the generation of the different polytype, and completed the manufacturing method of [1] above. Specifically, in the manufacturing method in [1] above, the silicon carbide source material having a flowability index of not less than 70 and not more than 100 is used.

According to the research by the present inventor, one of the causes of the generation of the different polytype resides in flowability of source material powders. Conventionally, the flowability of the source material powders has not been taken into consideration. Hence, when pouring the source material powders to pack them in the crucible, the source material powders cannot be packed uniformly, with the result that the source material powders may be packed in a partially imbalanced manner. If the source material is heated and sublimated in this state, an in-plane composition of the generated sublimation gas becomes non-uniform, thus presumably resulting in generation of a different polytype. Moreover, if a portion with a high packing density exists locally in the source material powders packed in the crucible, it is considered that particles are bonded together at this portion. Such a phenomenon is also expected to lead to non-uniform in-plane composition of the sublimation gas.

In view of this, by using the silicon carbide source material having a high flowability index as in [1] above, the source material powders can be uniformly packed in the crucible. Accordingly, a sublimation gas with a uniform in-plane composition can be generated, thereby manufacturing a silicon carbide single crystal in which a different polytype is suppressed from being mixed.

The "flowability index" herein represents a so-called "Carr's flowability index", which is a flowability index proposed by R. L. Carr. The flowability index is an index indicating ease of flow of powders, and ranges from a value of 0 to 100. A powder with more excellent flowability has a larger value of flowability index. In order to calculate the flowability index, the following four powder properties are used: (a) repose angle, (b) compressibility, (c) spatula angle, and (d) uniformity or cohesion. The flowability index can be determined by measuring the four powder properties, classifying respective measurement results into indexes of 0 to 25 based on the Carr's theory, and adding up them. The flowability index can be measured by a "powder tester" provided by Hosokawa Micron, or the like, for example. With one "powder tester", all the four powder properties can be measured to determine the flowability index. Of course, there may be used a measuring device having function and precision equivalent to those of the "powder tester".

(a) Repose Angle

The repose angle [unit: °] represents an angle (elevation angle) formed between slope and horizontal surface of a cone formed upon natural fall of powders. The cone herein represents a pile of powders. The pile of powders is formed by a pouring method, for example. The pouring method is to form a pile of powders by dropping powder samples through a funnel.

(b) Compressibility

The compressibility [unit: %] can be determined by (P−A)/P×100, where an aerated bulk density is represented by A and a packed bulk density is represented by P. Here, the "aerated bulk density" refers to a bulk density upon natural fall of powders. The aerated bulk density is measured by packing and measuring powder samples in a cup having a defined capacity. The "packed bulk density" refers to a bulk density when the powders are densely packed by tapping the cup to remove air from between the particles after measuring the aerated bulk density. The bulk density may be denoted as apparent specific gravity.

(c) Spatula Angle

The spatula angle [unit: °] is an angle formed between the slope and horizontal surface of a cone formed when putting powders on a spatula and then moving up the spatula. Specifically, the spatula angle is measured as follows. First, powders are put on the spatula, then the spatula is softly moved up vertically upward, and an angle between the slope and horizontal surface of the cone remaining on the spatula is measured. Next, a predetermined impact is applied, and then the angle between the slope and horizontal surface of the cone is measured again. The average value of the angles before and after the application of impact is employed as the spatula angle.

(d) Uniformity or Cohesion

When the particle sizes of the source material powders are generally not less than 300 μm, the uniformity is measured as the fourth item. The uniformity [unit: non-dimensional number] can be determined from a particle size distribution measured by sieving. The uniformity can be determined by dividing a particle size ($d_{60}$) at an accumulated value of 60% by a particle size ($d_{10}$) at an accumulated value of 10% in the particle size distribution.

The source material powders are strongly coherent. When the cohesion can be measured, the cohesion may be employed as the fourth item. The cohesion [unit: %] can be determined from an amount of powder samples having passed through a standard sieve after depositing the powder samples on the standard sieve and then vibrating the standard sieve for a predetermined time with a predetermined strength.

The measurement results of (a) to (d) are changed into indexes based on the criteria shown in Table 1. A total of the indexes is the flowability index.

TABLE 1

| (a) Repose Angle | | (b) Compressibility | | (c) Spatula Angle | | (d) Uniformity | | Cohesion | |
|---|---|---|---|---|---|---|---|---|---|
| [°] | Index | [%] | Index | [°] | Index | [−] | Index | [%] | Index |
| <25 | 25 | <5 | 25 | <25 | 25 | 1 | 25 | | |
| 26 to 29 | 24 | 6 to 9 | 23 | 26 to 30 | 24 | 2 to 4 | 24 | | |
| 30 | 22.5 | 10 | 22.5 | 31 | 22.5 | 5 | 22.5 | | |
| 32 | 22 | 11 | 22 | 32 | 22 | 6 | 22 | | |
| 32 to 34 | 21 | 12 to 14 | 21 | 33 to 37 | 21 | 7 | 21 | | |
| 35 | 20 | 15 | 20 | 38 | 20 | 8 | 20 | | |
| 36 | 19.5 | 16 | 19.5 | 39 | 19.5 | 9 | 19.5 | | |
| 37 to 39 | 18 | 17 to 19 | 18 | 40 to 44 | 18 | 10 to 11 | 18 | | |
| 40 | 17.5 | 20 | 17.5 | 45 | 17.5 | 12 | 17.5 | | |
| 41 | 17 | 21 | 17 | 46 | 17 | 13 | 17 | | |
| 42 to 44 | 16 | 22 to 24 | 16 | 47 to 59 | 16 | 14 to 16 | 16 | | |
| 45 | 15 | 25 | 15 | 60 | 15 | 17 | 15 | <6 | 15 |
| 46 | 14.5 | 26 | 14.5 | 61 | 14.5 | 18 | 14.5 | 6 to 9 | 14.5 |
| 47 to 54 | 12 | 27 to 30 | 12 | 62 to 74 | 12 | 19 to 21 | 12 | 10 to 29 | 12 |
| 55 | 10 | 31 | 10 | 75 | 10 | 22 | 10 | 30 | 10 |
| 56 | 9.5 | 32 | 9.5 | 76 | 9.5 | 23 | 9.5 | 31 | 9.5 |
| 57 to 64 | 7 | 33 to 36 | 7 | 77 to 89 | 7 | 24 to 26 | 7 | 33 to 54 | 7 |
| 65 | 5 | 37 | 5 | 90 | 5 | 27 | 5 | 55 | 5 |
| 66 | 4.5 | 38 | 4.5 | 91 | 4.5 | 28 | 4.5 | 56 | 4.5 |
| 67 to 89 | 2 | 39 to 45 | 2 | 92 to 99 | 2 | 29 to 35 | 2 | 57 to 79 | 2 |
| 90 | 0 | 45< | 0 | 99< | 0 | 35 | 0 | 79< | 0 |

In Table 1, a notation such as "<25" represents a value less than 25, for example. A notation such as "45<" represents a value more than 45. Moreover, a notation such as "26 to 29" represents a value of 26 to 29.

[2] The flowability index of the silicon carbide source material may be not less than 80 and not more than 100.

[3] The flowability index of the silicon carbide source material may be not less than 90 and not more than 100.

[4] A method for manufacturing a silicon carbide single crystal in the present disclosure includes: packing a silicon carbide source material into a crucible, the silicon carbide source material having a flowability index of not less than 90 and not more than 100; and sublimating the silicon carbide source material by heating the silicon carbide source material.

According to the above manufacturing method, there can be provided a silicon carbide single crystal in which a different polytype is suppressed from being mixed.

[Details of Embodiments of the Present Disclosure]

The following describes one embodiment (hereinafter, referred to as "the present embodiment") of the present disclosure in detail; however, the present embodiment is not limited to this. In the description below, the same or corresponding elements are given the same reference characters and are not described repeatedly.

[Method for Manufacturing Silicon Carbide Single Crystal]

FIG. 1 is a flowchart schematically showing a method for manufacturing a silicon carbide single crystal according to the present embodiment. As shown in FIG. 1, the manufacturing method includes a source material packing step (S01) and a source material sublimating step (S02). Hereinafter, each of the steps will be described.

[Source Material Packing Step (S01)]

Figure 2:
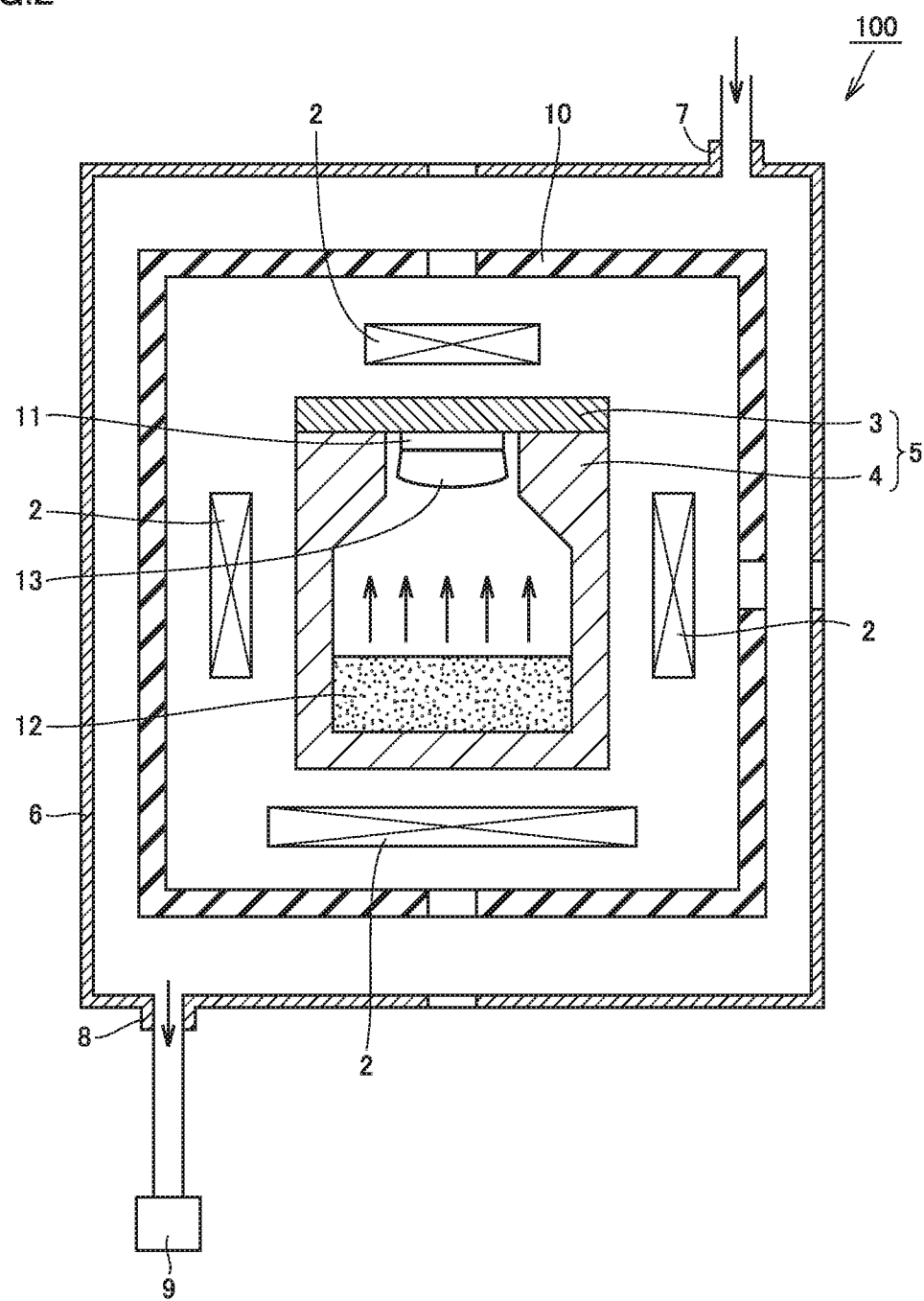
FIG. 2 is a schematic cross sectional view illustrating the method for manufacturing the silicon carbide single crystal in the present disclosure.

FIG. 2 is a schematic cross sectional view illustrating the method for manufacturing the silicon carbide single crystal according to the present embodiment. A crystal growth apparatus 100 shown in FIG. 2 includes a chamber 6. Chamber 6 is provided with a gas inlet 7 and a gas outlet 8. Gas outlet 8 is connected to an exhaust pump 9. In chamber 6, a crucible 5, a resistive heater 2, and a heat insulator 10 are disposed. Crucible 5, resistive heater 2, and heat insulator 10 are composed of graphite, for example.

Crucible 5 includes a mount 3 and an accommodation portion 4. Mount 3 is configured to hold a seed crystal 11. Mount 3 also functions as a cover of crucible 5. Seed crystal 11 is a silicon carbide single-crystal substrate composed of 4H—SiC, for example. Seed crystal 11 may have a diameter of not less than 100 mm, not less than 150 mm, or not less than 200 mm, for example. As the diameter of the seed crystal is larger, a silicon carbide single crystal having a larger diameter can be grown. Moreover, it is considered that as the diameter of the silicon carbide single crystal is larger, a different polytype is more likely to be mixed. Hence, it is expected that the effect of suppressing the different polytype in the present embodiment is more noticeable as the diameter is larger. The diameter of the seed crystal may be not more than 300 mm, for example.

Accommodation portion 4 has a cylindrical outer shape with a bottom, for example. In the source material packing step, a silicon carbide source material 12 having a flowability index of not less than 70 and not more than 100 is packed in accommodation portion 4, i.e., crucible 5. The silicon carbide source material is powders obtained by pulverizing silicon carbide polycrystal, for example. The silicon carbide source material may have a $d_{50}$ of about 300 to 700 μm or about 400 to 600 μm, for example. Here, "$d_{50}$" is defined to represent a particle size at an accumulated value of 50% in a particle size distribution measured by sieving. The "powder tester" described above is also capable of measuring $d_{50}$.

The method for preparing the silicon carbide source material having a flowability index of not less than 70 and not more than 100 is not limited particularly. For example, some silicon carbide polycrystal powders are obtained from market and the above-mentioned "powder tester" is used to measure the flowability index in order to screen powders having a flowability index of not less than 70 and not more than 100. The flowability index of the silicon carbide source material is preferably not less than 80, is more preferably not less than 90, and is particularly preferably not less than 95. It is expected that the state of the packed silicon carbide source material become more uniform in the crucible as the flowability index of the silicon carbide source material is higher.

After pouring silicon carbide source material 12 into accommodation portion 4, silicon carbide source material 12 may be provided with appropriate vibrations by slightly shaking or tapping accommodation portion 4 to adjust the surface of the powder layer to be flat, for example. Since the flowability index of the silicon carbide source material is not less than 70 in the present embodiment, the silicon carbide source material can be uniformly packed in the accommodation portion.

[Source Material Sublimating Step (S02)]

In the source material sublimating step (S02), silicon carbide source material 12 is sublimated by heating silicon carbide source material 12. The sublimated silicon carbide source material is re-deposited on seed crystal 11 and grows as a silicon carbide single crystal 13.

Crucible 5 is heated by resistive heater 2. Accordingly, silicon carbide source material 12 is heated and a predetermined temperature gradient is formed in crucible 5. On this occasion, a temperature around silicon carbide source material 12 may be adjusted to about 2300 to 2500° C., for example. Moreover, a temperature around seed crystal 11 is adjusted at about 2000 to 2300° C., for example. The temperature of each portion of crucible 5 is measured, for example, by a radiation thermometer (not shown).

From gas inlet 7, inert gas such as argon (Ar) gas is introduced. The introduced inert gas is exhausted from gas outlet 8 by exhaust pump 9. A pressure in chamber 6 is adjusted through an amount of introduction of the inert gas and an amount of exhaust of the inert gas. The sublimation of silicon carbide source material 12 is controlled through the pressure in chamber 6. That is, for example, when the pressure in chamber 6 is decreased to not more than 5 kPa with silicon carbide source material 12 being heated, silicon carbide source material 12 starts to be sublimated. The resulting sublimation gas is re-deposited on seed crystal 11 and grows as silicon carbide single crystal 13.

In the present embodiment, since silicon carbide source material 12 is uniformly packed in crucible 5 as described above, an in-plane composition of the generated sublimation gas becomes uniform. Accordingly, a different polytype is suppressed from being mixed in silicon carbide single crystal 13.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

2: resistive heater; 3: mount; 4: accommodation portion; 5: crucible; 6: chamber; 7: gas inlet; 8: gas outlet; 9: exhaust pump; 10: heat insulator; 11: seed crystal; 12: silicon carbide source material; 13: silicon carbide single crystal; 100: crystal growth apparatus.

The invention claimed is:

1. A method for manufacturing a silicon carbide single crystal, the method comprising:
   packing a silicon carbide source material into a crucible, the silicon carbide source material having a Carr's flowability index of not less than 70 and not more than 100; and
   sublimating the silicon carbide source material by heating the silicon carbide source material,
   a seed crystal having a diameter of not less than 150 mm being used.

2. The method for manufacturing the silicon carbide single crystal according to claim 1, wherein the flowability index of the silicon carbide source material is not less than 80 and not more than 100.

3. The method for manufacturing the silicon carbide single crystal according to claim 1, wherein the flowability index of the silicon carbide source material is not less than 90 and not more than 100.

4. A method for manufacturing a silicon carbide single crystal, the method comprising:
packing a silicon carbide source material into a crucible, the silicon carbide source material having a Carr's flowability index of not less than 90 and not more than 100; and
sublimating the silicon carbide source material by heating the silicon carbide source material,
a seed crystal having a diameter of not less than 150 mm being used.

* * * * *